(12) United States Patent
Ohmori et al.

(10) Patent No.: US 9,099,642 B2
(45) Date of Patent: Aug. 4, 2015

(54) MEMORY ELEMENT AND MEMORY DEVICE

(71) Applicant: Sony Corporation, Tokyo (JP)

(72) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP); Tetsuya Asayama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/559,167

(22) Filed: Dec. 3, 2014

(65) Prior Publication Data

US 2015/0137288 A1 May 21, 2015

Related U.S. Application Data

(63) Continuation of application No. 13/465,755, filed on May 7, 2012, now Pat. No. 8,923,037.

(30) Foreign Application Priority Data

May 19, 2011 (JP) ................. 2011-112219

(51) Int. Cl.
*G11C 11/00* (2006.01)
*H01L 43/10* (2006.01)
(Continued)

(52) U.S. Cl.
CPC .............. *H01L 43/10* (2013.01); *H01L 43/02* (2013.01); *H01L 43/08* (2013.01)

(58) Field of Classification Search
CPC ...................................... G11C 11/00

USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 428/810–816, 428/817–825.1, 826; 438/3; 977/933–935
See application file for complete search history.

(56) References Cited

U.S. PATENT DOCUMENTS 6,842,317 B2 * 1/2005 Sugita et al. ............... 360/324.2
6,845,038 B1 * 1/2005 Shukh .......................... 365/171

(Continued)

FOREIGN PATENT DOCUMENTS

CN 1495793 5/2004
JP 2001-308413 11/2001

(Continued)

OTHER PUBLICATIONS

Ikeda et al., "A perpendicular-anisotropy CoFeB—MgO magnetic tunnel junction," Nature Materials, vol. 9, Sep. 2010, pp. 721-724, published online Jul. 11, 2010. (4 pages).

(Continued)

*Primary Examiner* — Harry W Byrne
(74) *Attorney, Agent, or Firm* — K&L Gates LLP

(57) ABSTRACT

Spin transfer torque memory elements and memory devices are provided. In one embodiment, the spin transfer torque memory element includes a first portion including CoFeB, a second portion including CoFeB, an intermediate portion interposed between the first and second portions, a third portion adjoining the second portion opposite the intermediate portion, and a fourth portion adjoining the third portion opposite the second portion. The intermediate portion includes MgO. The third portion includes at least one of Ag, Au, Cr, Cu, Hf, Mo, Nb, Os, Re, Ru, Ta, W, and Zr. The fourth portion includes at least one alloy of Co, Fe, Pd, and Pt.

20 Claims, 10 Drawing Sheets

(51) Int. Cl.
*H01L 43/02* (2006.01)
*H01L 43/08* (2006.01)

(56) References Cited

U.S. PATENT DOCUMENTS

| | | | |
|---|---|---|---|
| 7,576,956 B2* | 8/2009 | Huai | 360/324.2 |
| 7,675,129 B2* | 3/2010 | Inomata et al. | 257/421 |
| 7,859,034 B2* | 12/2010 | Huai et al. | 257/295 |
| 7,989,223 B2* | 8/2011 | Inomata et al. | 438/3 |
| 8,085,582 B2* | 12/2011 | Nakamura et al. | 365/158 |
| 2001/0036046 A1 | 11/2001 | Mizuguchi | |
| 2002/0163766 A1* | 11/2002 | Eguchi et al. | 360/324.12 |
| 2003/0091864 A1 | 5/2003 | Hoshino et al. | |
| 2004/0047177 A1 | 3/2004 | Fukuzumi | |
| 2004/0080876 A1* | 4/2004 | Sugita et al. | 360/324.2 |
| 2004/0188733 A1* | 9/2004 | Asao et al. | 257/295 |
| 2005/0036361 A1* | 2/2005 | Fukuzumi | 365/158 |
| 2005/0133840 A1 | 6/2005 | Pietambaram et al. | |
| 2005/0208680 A1 | 9/2005 | Ruehrig et al. | |
| 2006/0018057 A1* | 1/2006 | Huai | 360/324.2 |
| 2006/0044703 A1* | 3/2006 | Inomata et al. | 360/324.1 |
| 2008/0151607 A1 | 6/2008 | Hosomi et al. | |
| 2009/0015958 A1* | 1/2009 | Nakamura et al. | 360/55 |
| 2009/0180308 A1* | 7/2009 | Inomata et al. | 365/145 |
| 2009/0243008 A1 | 10/2009 | Kitagawa et al. | |
| 2010/0072524 A1* | 3/2010 | Huai et al. | 257/295 |
| 2010/0078310 A1 | 4/2010 | Tsunekawa et al. | |

FOREIGN PATENT DOCUMENTS

| | | |
|---|---|---|
| JP | 2003-152240 | 5/2003 |
| JP | 2004-193595 | 7/2004 |
| JP | 2007-515075 | 6/2007 |
| JP | 2009-081215 | 4/2009 |
| JP | 2009-239120 | 10/2009 |
| JP | 2010-109319 | 5/2010 |
| TW | 200304700 | 10/2003 |
| TW | 200828304 | 7/2008 |
| WO | 2010/064476 | 6/2010 |
| WO | 2010/137679 | 12/2010 |

OTHER PUBLICATIONS

Notification of Reason for Refusal issued in connection with Japanese Patent Application No. 2011-112219, dated Mar. 3, 2015. (8 pages).

* cited by examiner

FIG. 4A

| Ta: 5 nm |
| Ru: 5 nm |
| Co₇₀Pt₃₀ :3 nm | } 20
| Ru | } 19
| Fe₆₄Co₁₆B₂₀ :0.5 nm |
| Ta: 0.1 nm | } 15
| Fe₆₄Co₁₆B₂₀ :0.5 nm |
| MgO: 1 nm |
| Ru: 1 nm |
| Ta: 5 nm | } 14

FIG. 4B

| Ta: 5 nm |
| Ru: 1 nm |
| MgO: 1 nm |
| Fe₆₄Co₁₆B₂₀ :0.5 nm |
| Ta: 0.1 nm |
| Fe₆₄Co₁₆B₂₀ :0.5 nm |
| Ta: 0.05 nm | } 21
| Ru | } 22
| Co₇₀Pt₃₀ :3 nm |
| Ru: 5 nm |
| Ta: 5 nm |

FIG. 4C

| Ta: 5 nm |
| Ru: 1 nm |
| MgO: 1 nm |
| Fe₆₄Co₁₆B₂₀ :0.8 nm |
| Ta | } 21
| Ru | } 22
| Co₇₀Pt₃₀ :3 nm |
| Ru: 5 nm |
| Ta: 5 nm |

Type of added element: Ta, Cr, Mg, Si, W, Nb, Zr, Hf, Mo

FIG. 4D

| Ta: 5 nm |
| Ru: 1 nm |
| MgO: 1 nm |
| Fe₆₄Co₁₆B₂₀ :0.5 nm |
| Ta: 0.1 nm |
| Fe₆₄Co₁₆B₂₀ :0.5 nm |
| ADDITION | } 21
| Ru: 0.6 nm | } 22
| Co₇₀Pt₃₀ :3 nm |
| Ru: 5 nm |
| Ta: 5 nm |

Type of added element: Cu, Ag, Au

FIG. 4E

| Ta: 5 nm |
| Ru: 1 nm |
| MgO: 1 nm |
| Fe₆₄Co₁₆B₂₀ :0.8 nm |
| Ta: 0.3 nm |
| Fe₆₄Co₁₆B₂₀ :0.8 nm |
| ADDITION | } 21
| Ru: 0.8 nm | } 22
| Co₇₀Pt₃₀ :3 nm |
| Ru: 5 nm |
| Ta: 5 nm |

FIG. 5
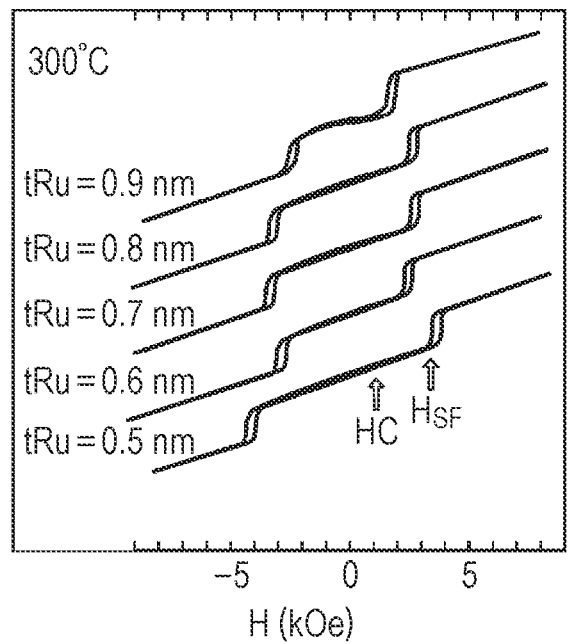
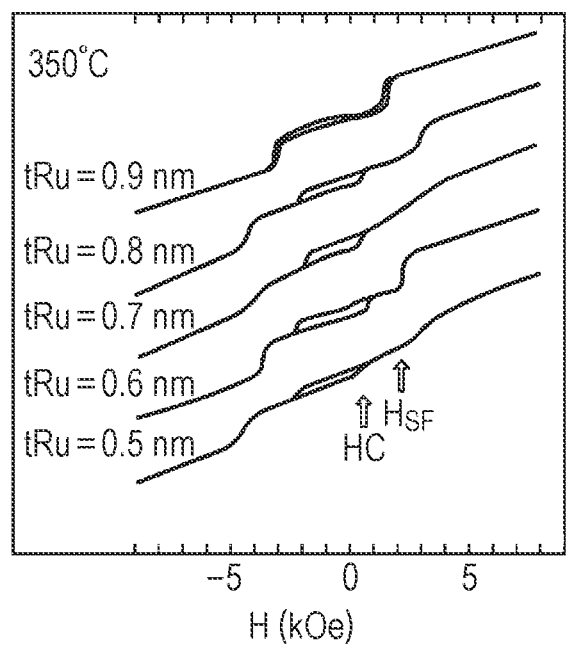

FIG. 6
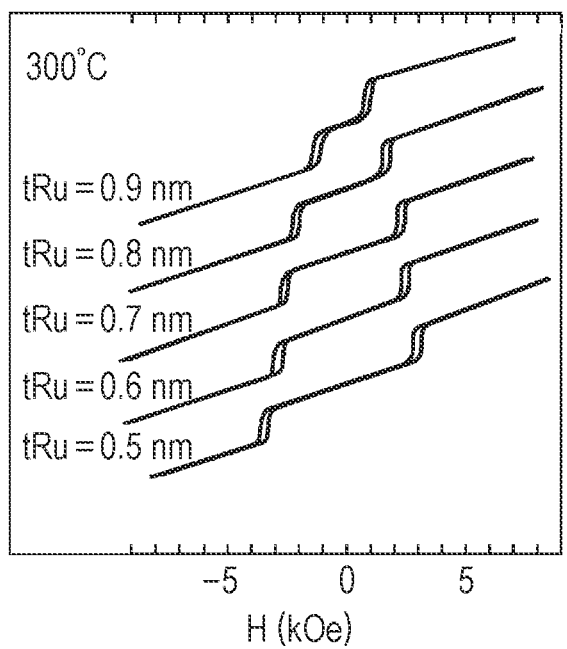
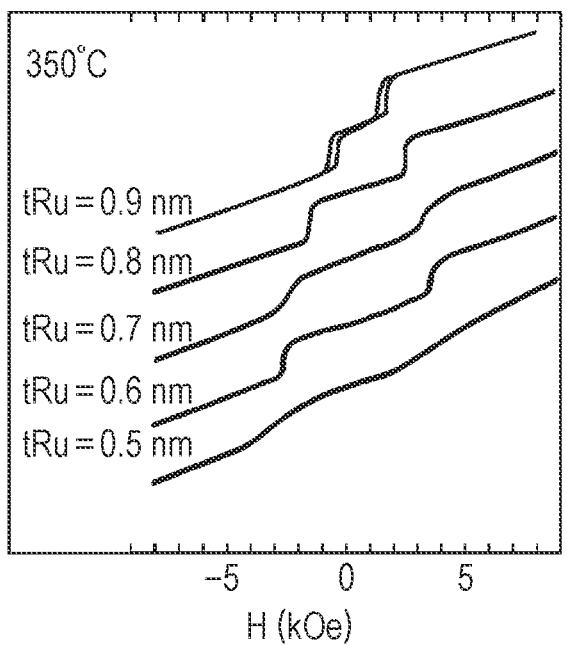

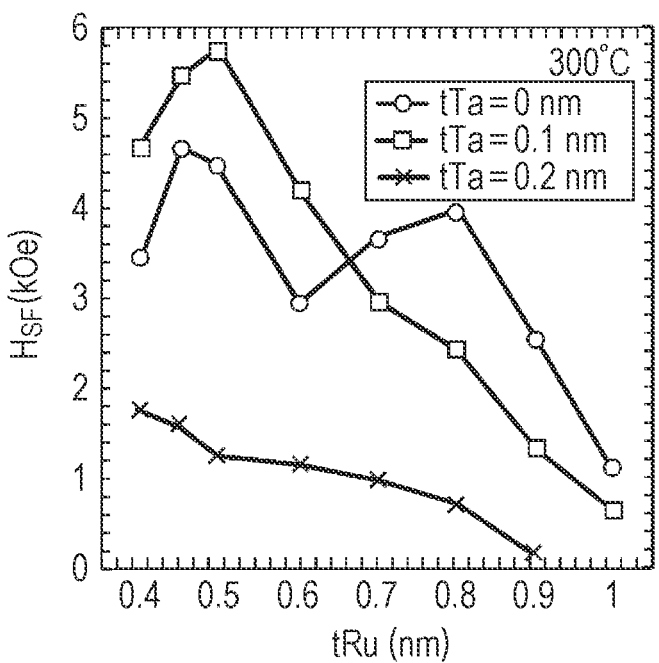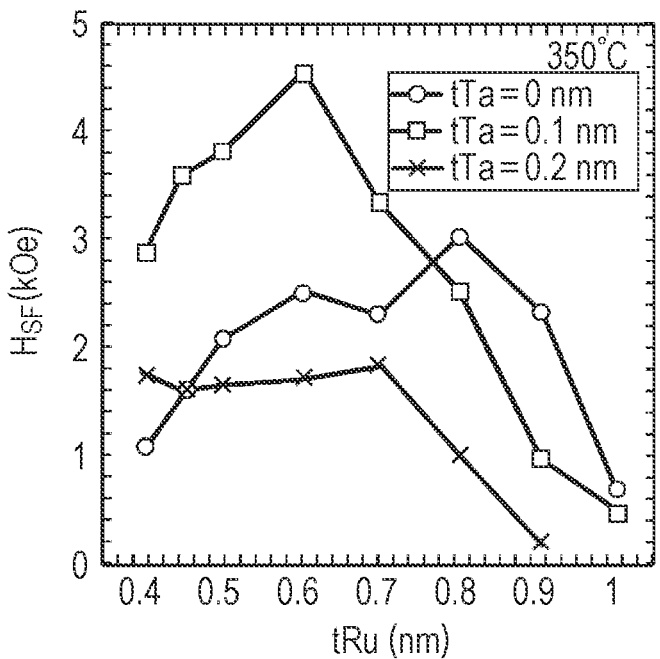
FIG. 7

FIG. 8
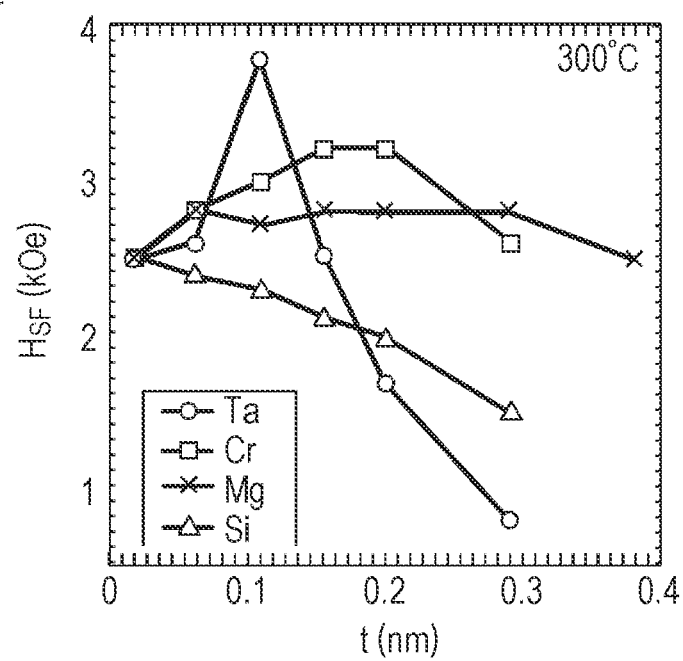
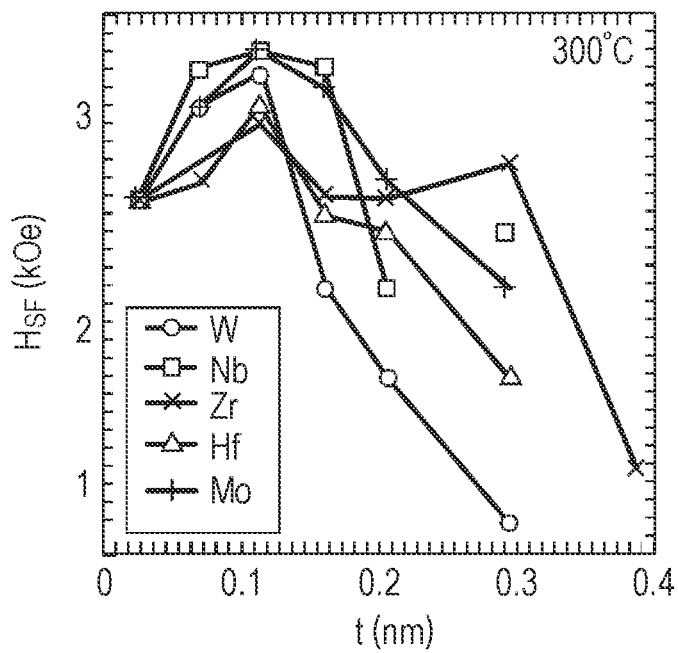

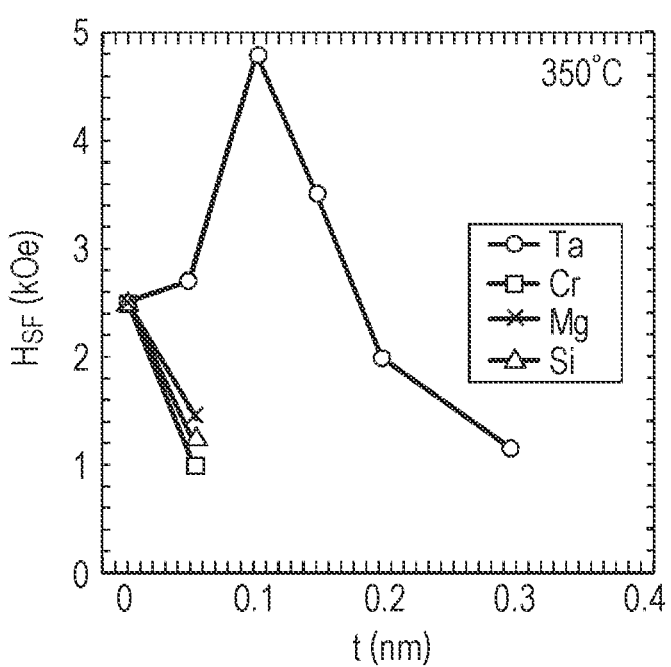
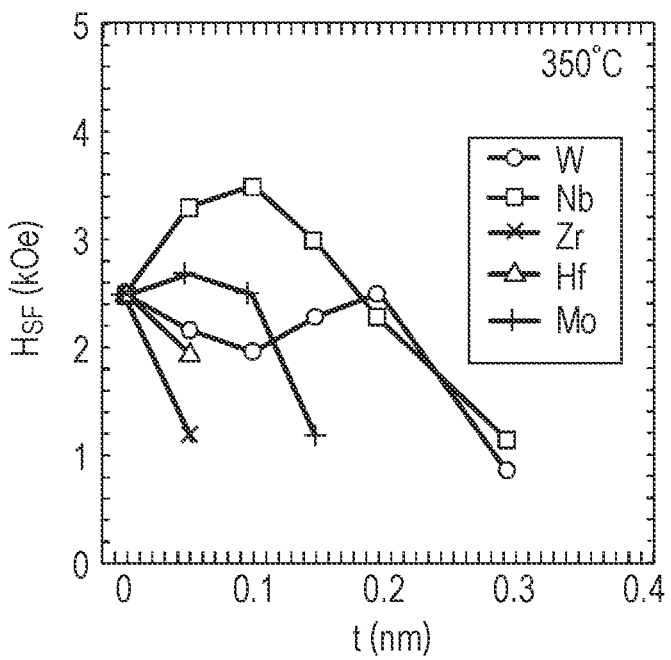
FIG. 9

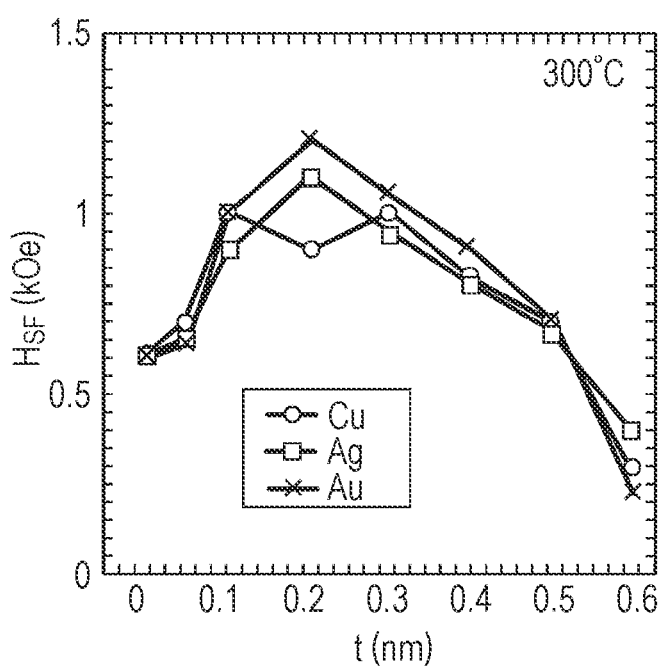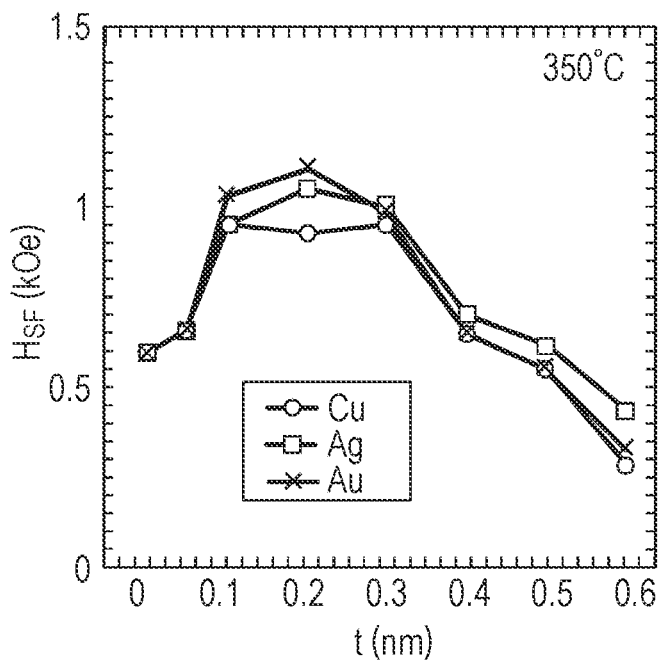
FIG. 10

FIG. 11

| | SAMPLE INCLUDING ONE MAGNETIC COUPLING LAYER | SAMPLE INCLUDING TWO MAGNETIC COUPLING LAYERS | | | |
|---|---|---|---|---|---|
| | | 1 | 2 | 3 | 4 |
| | Ta: 5 nm | Ta: 5 nm | Ta: 5 nm | Ta: 5 nm | Ta: 5 nm |
| 17 | $Fe_{64}Co_{16}B_{20}$ : 1.4 nm | $Fe_{64}Co_{16}B_{20}$ : 1.4 nm | $Fe_{64}Co_{16}B_{20}$ : 1.4 nm | $Fe_{60}Ni_{30}C_{10}$ : 1.2 nm | $Fe_{64}Co_{16}B_{20}$ : 1.5 nm |
| 16 | MgO: 1 nm | MgO: 1 nm | MgO: 1 nm | MgO: 1 nm | MgO: 1 nm |
| 15 | $Fe_{64}Co_{16}B_{20}$ : 0.8 nm | $Fe_{64}Co_{16}B_{20}$ : 0.8 nm | $Fe_{64}Co_{16}B_{20}$ : 1.2 nm | $Fe_{64}Co_{16}B_{20}$ : 0.8 nm | $Fe_{50}Co_{10}Cr_{20}B_{20}$: 0.8 nm |
| 19 | Ru: 0.8 nm | Ta: 0.1 nm | Ta: 0.1 nm | Ta: 0.1 nm | Ta: 0.05 nm | 21
| | | Ru: 0.6 nm | Ru: 0.6 nm | Re: 0.7 nm | Os: 0.8 nm | 22
| 20 | CoPt: 2 nm | CoPt: 2 nm | CoPt: 2 nm | CoPt: 2 nm | FePt: 2 nm |
| 14 | Ru: 5 nm | Ru: 5 nm | Ru: 5 nm | Ru: 5 nm | TiN: 5 nm |
| | Ta: 5 nm | Ta: 5 nm | Ta: 5 nm | Ta: 5 nm | Ta: 5 nm |

MEMORY ELEMENT AND MEMORY DEVICE

CROSS REFERENCES TO RELATED APPLICATIONS

The present application is a continuation of U.S. application Ser. No. 13/465,755, filed on May 7, 2012, which claims priority to Japanese Priority Patent Application JP 2011-112219 filed in the Japan Patent Office on May 19, 2011, the entire content of each of which is hereby incorporated by reference.

BACKGROUND

The present disclosure relates to a memory element including a memory layer to store the information of the magnetization state of a ferromagnetic layer and a magnetization pinned layer, in which the direction of magnetization is pinned, wherein the direction of magnetization of the memory layer is changed by passing a current and a memory device provided with this memory element.

Regarding information apparatuses, e.g., computers, DRAM with high-speed operation and high density has been used widely as random access memory.

However, the dynamic random access memory (DRAM) is a volatile memory in which the information disappears when the power is turned off. Consequently, a nonvolatile memory, in which the information does not disappear, has been desired.

As for a candidate for the nonvolatile memory, a magnetic random access memory (MRAM), in which the information is stored through magnetization of a magnetic substance, has been noted and developed.

As for a method for storing into MRAM, a spin torque MRAM, in which magnetization of a magnetic substance responsible for memory is reversed by a spin torque passing between two magnetic substances, as disclosed in, for example, Japanese Unexamined Patent Application Publication No. 2004-193595, has been noted because the structure is relatively simple and the number of rewriting is large.

In many cases, the memory element making use of spin torque magnetization reversal is formed on the basis of magnetic tunnel junction (MTJ) in the same manner as that of MRAM. This configuration makes use of the fact that when a spin-polarized electron passing a magnetic layer pinned in some direction enters other free (the direction is not pinned) magnetic layer, a torque is given to the magnetic layer (this is may be referred to as a spin transfer torque), and the free magnetic layer is reversed when a current more than or equal to a certain threshold value is passed. Rewriting of 0/1 is performed by changing the polarity of the current.

The absolute value of the current for reversal is 1 mA or less with respect to an element on a scale of about 0.1 μm. In addition, this current value decreases in proportion to the element volume and, therefore, scaling is possible. Furthermore, a word line for generating a current magnetic field for memory, which is necessary for MRAM, is unnecessary and, therefore, there is an advantage that the cell structure becomes simple.

Hereafter, MRAM making use of the spin torque magnetization reversal is referred to as "spin torque MRAM" or "spin torque-magnetic random access memory (ST-MRAM)". The spin torque magnetization reversal may be referred to as spin injection magnetization reversal.

As for ST-MRAM, those making use of in-plane magnetization, as disclosed in, for example, Japanese Unexamined Patent Application Publication No. 2004-193595, and those making use of perpendicular magnetization, as disclosed in, for example, Japanese Unexamined Patent Application Publication No. 2009-081215, have been developed.

Regarding ST-MRAM making use of in-plane magnetization, the degree of flexibility in material is high and a method for pinning magnetization is relatively easy. However, in the case where a perpendicular magnetic film is used, the materials having the perpendicular magnetic anisotropy are limited.

In recent years, an interface anisotropy type perpendicular magnetic film making use of perpendicular magnetic anisotropy which appears at a crystal interface between Fe and an oxide, as disclosed in, for example, Nature Materials., Vol 9, p. 721 (2010), has been noted. In the case where the interface anisotropy is used, a perpendicular magnetic film can be obtained by using an FeCoB alloy as a magnetic substance and MgO as an oxide, the compatibility between a high magnetoresistance ratio (MR ratio) and perpendicular magnetization can be ensured, so that it has a potential for both the memory layer and the magnetization pinned layer. Therefore, application to perpendicular magnetization type spin torque MRAM is expected.

SUMMARY

By the way, in order to use the above-described interface anisotropy type material for the spin torque MRAM, it is believed to be necessary that the coercive force of the magnetic substance of at least the magnetization pinned layer is sufficiently larger than the coercive force of the memory layer. In order to increase the coercive force of the magnetization pinned layer, the coercive force of the magnetization pinned layer may be enhanced by magnetically coupling a high coercive force layer having large magnetocrystalline anisotropy with the magnetization pinned layer. Furthermore, it is preferable that a magnetic coupling layer having an appropriate thickness to form strong magnetic coupling is inserted between the magnetization pinned layer and the high coercive force layer to magnetically couple the magnetization pinned layer with the high coercive force layer in an antiparallel manner because leakage magnetic fields from the magnetization pinned layer and the high coercive force layer cancel each other, so as to reduce a magnetic effect on the memory layer. However, if the high coercive force layer and the magnetic coupling layer are stacked on the magnetization pinned layer, influences of reducing the MR ratio, lowering the heat resistance temperature, and the like are exerted as compared with the case of only the magnetization pinned layer.

It is desirable that regarding a spin torque MRAM, a perpendicular magnetization pinned layer having a large perpendicular coercive force and excellent heat resistance (heat stability) is realized in order to perform stable operation.

According to an embodiment of the present disclosure, a spin transfer torque memory element includes a first portion including CoFeB, a second portion including CoFeB, an intermediate portion interposed between the first and second portions, a third portion adjoining the second portion opposite the intermediate portion, and a fourth portion adjoining the third portion opposite the second portion. The intermediate portion includes MgO. The third portion includes at least one of Ag, Au, Cr, Cu, Hf, Mo, Nb, Os, Re, Ru, Ta, W, and Zr. The fourth portion includes at least one alloy of Co, Fe, Pd, and Pt.

According to another embodiment of the present disclosure, a memory device includes a spin transfer torque memory element configured to be disposed between two wires that intersect each other when viewed along a direction perpendicular to the two wires. The spin transfer torque memory element holds information according to a magnetization state of a magnetic material. The memory element includes a first portion including CoFeB, a second portion including CoFeB, an intermediate portion interposed between the first and second portions, a third portion adjoining the second portion opposite the intermediate portion, and a fourth portion adjoining the third portion opposite the second portion. The intermediate portion includes MgO. The third portion includes at least one of Ag, Au, Cr, Cu, Hf, Mo, Nb, Os, Re, Ru, Ta, W, and Zr. The fourth portion includes at least one alloy of Co, Fe, Pd, and Pt.

In embodiments according to the present disclosure, as described above, the memory element is specified to have a structure in which the magnetic coupling layer is disposed adjoining the magnetization pinned layer and opposing to the intermediate layer and the high coercive force layer is disposed adjoining the magnetic coupling layer, and thereby, the element has an enhanced coercive force and excellent heat stability.

According to embodiments of the present disclosure, a memory element having perpendicular magnetic anisotropy is obtained easily, and the heat stability serving as an information holding capability is ensured sufficiently, so that a memory element is configured to have excellent balance between characteristics. Consequently, operation errors are reduced and an operation margin of the memory element is obtained sufficiently.

Therefore, a stably operated high-reliability memory is realized.

Furthermore, it becomes possible to reduce a rewriting current, so as to reduce power consumption in rewriting into a memory element.

As a result, it becomes possible to reduce power consumption of the whole memory device.

Additional features and advantages are described herein, and will be apparent from the following Detailed Description and the figures.

BRIEF DESCRIPTION OF THE FIGURES

FIGS. 4A to 4E are explanatory diagrams of the layered structures of samples used in experiments;

FIG. 5 is a diagram showing the relationship between the thickness of a magnetic coupling layer (Ru) and the magnitude of change in magnetization reversal;

FIG. 6 is a diagram showing the relationship between the thickness of a magnetic coupling layer (Ru) and the magnitude of change in magnetization reversal, where two layers of a magnetic coupling layer (Ru) and a magnetic coupling layer (Ta) are disposed;

FIG. 7 is a diagram showing the relationship between changes in the thickness of a magnetic coupling layer (Ru) and in the thickness of a magnetic coupling layer (Ta) and the magnitude of a magnetic field of magnetization reversal;

FIG. 8 is a diagram showing the relationship between changes in the thickness of a magnetic coupling layer (Ta), where the material was changed to an element, e.g., Cr, other than Ta, and in the thickness of a magnetic coupling layer (Ru) and the magnitude of a magnetic field of magnetization reversal after a heat treatment at 300° C.;

FIG. 9 is a diagram showing the relationship between changes in the thickness of a magnetic coupling layer (Ta), where the material was changed to an element, e.g., Cr, other than Ta, and in the thickness of a magnetic coupling layer (Ru) and the magnitude of a magnetic field of magnetization reversal after a heat treatment at 350° C.;

FIG. 10 is a diagram showing the relationship between changes in the thickness of a magnetic coupling layer (Ta), where the material was changed to an element, e.g., Cu, other than Ta, and in the thickness of a magnetic coupling layer (Ru) and the magnitude of a magnetic field of magnetization reversal;

FIG. 11 is a diagram of the layered structure of a sample for measurement of the magnetoresistance ratio (MR ratio).

DETAILED DESCRIPTION

The embodiments according to the present disclosure will be described below in the following order.

1. Configuration of memory device according to embodiment
2. Outline of memory element according to embodiment
3. Concrete configuration of embodiment
4. Experiment on embodiment
1. Configuration of Memory Device According to Embodiment Initially, the configuration of a memory device according to an embodiment of the present disclosure will be explained.

Figure 1:
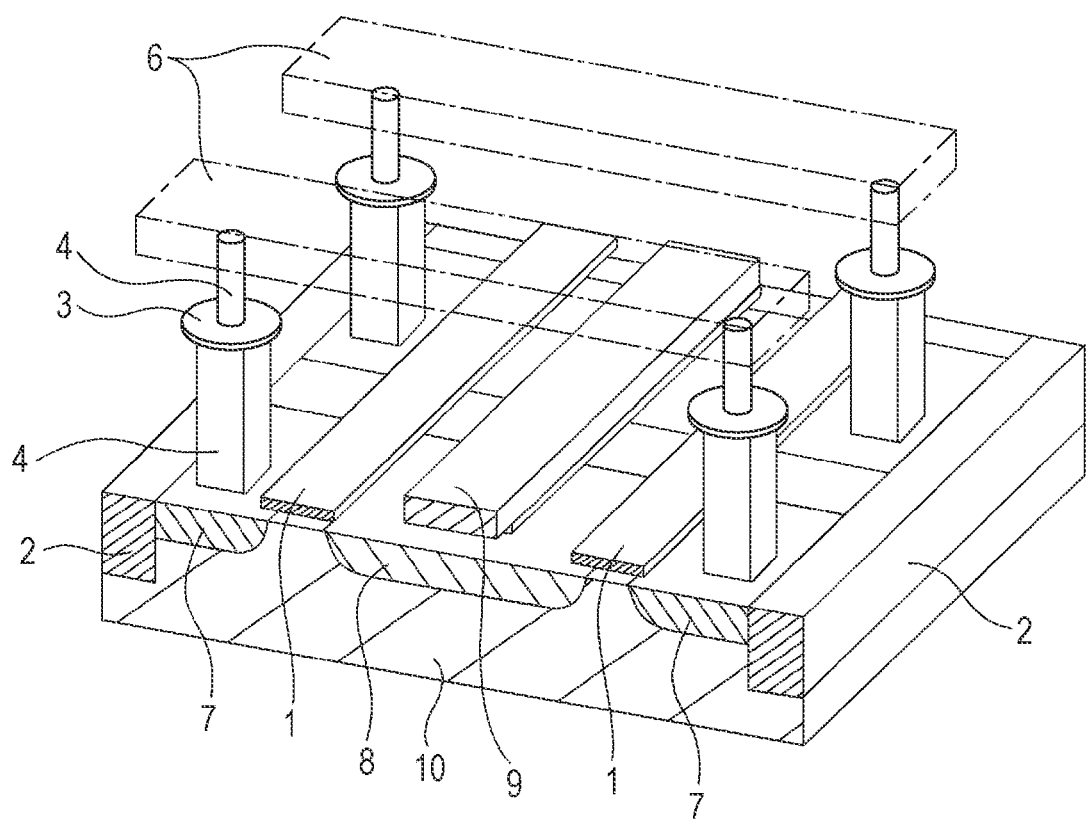
FIG. 1 is a schematic perspective view of the configuration of a memory device according to an embodiment.
Figure 2:
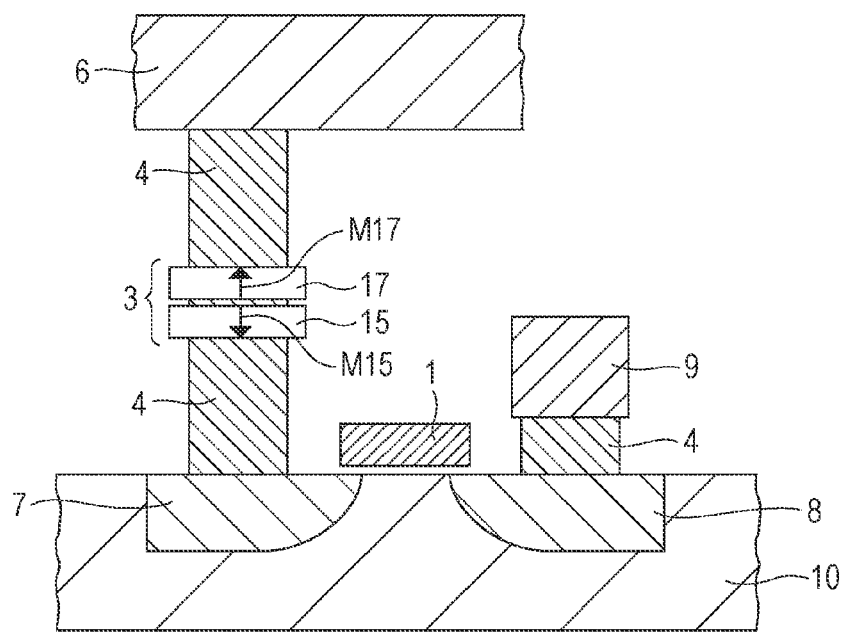
FIG. 2 is a sectional view of a memory device according to an embodiment.

FIG. 1 and FIG. 2 are schematic diagrams of a memory device (ST-MRAM). FIG. 1 is a perspective view and FIG. 2 is a sectional view.

As shown in FIG. 1, a drain region 8, a source region 7, and a gate electrode 1 constituting a selection transistor to select each memory element 3 are disposed in each portion isolated by an element isolation layer 2 on a semiconductor base member 10, e.g., a silicon substrate. Among them, the gate electrode 1 also serves as a word line extended forward and backward in FIG. 1.

The drain region 8 is disposed while being shared between right and left selection transistors in FIG. 2, and a wiring 9 is connected to the drain region 8.

A memory element 3 having a memory layer is disposed between the source region 7 and a bit line 6 which is disposed above and which is extended in the right and left directions in FIG. 1, and the direction of magnetization of the memory layer is reversed through spin torque magnetization reversal. This memory element 3 is formed from, for example, a magnetic tunnel junction element (MTJ element).

As shown in FIG. 2, the memory element 3 includes two magnetic layers 15 and 17. Regarding these two magnetic layers 15 and 17, one magnetic layer is specified to be a magnetization pinned layer 15, where the direction of magnetization M15 is pinned. The other magnetic layer is specified to be a magnetic free layer, that is, memory layer 17, where the direction of magnetization M17 is changed.

The memory element 3 is connected to the bit line 6 and the source region 7 with upper and lower contact layers 4, respectively.

Consequently, it is possible that a current is passed to the memory element 3 and, thereby, the direction of magnetization M17 of the memory layer 17 is reversed through spin injection.

Regarding such a memory device, it is necessary that writing is performed with a current less than or equal to the saturation current of the selection transistor. It is known that the saturation current of the transistor is reduced along with miniaturization. Therefore, reduction of a current passing the memory element 3 by an improvement in the efficiency of spin transfer is favorable for miniaturization of the memory device.

In order to enhance a read signal, it is necessary to ensure a magnetoresistance ratio. For that purpose, it is effective that the above-described MTJ structure is adapted, that is, the memory element 3 has a configuration in which an intermediate layer serving as a tunnel insulating layer (tunnel barrier layer) is disposed between the two magnetic layers 15 and 17.

In the case where the tunnel insulating layer is used as the intermediate layer, as described above, the amount of current passed to the memory element 3 is limited in order to prevent dielectric breakdown of the tunnel insulating layer. That is, preferably, the current necessary for spin torque magnetization reversal is suppressed from the viewpoint of ensuring the reliability with respect to repetition of writing of the memory element 3. In this regard, the current necessary for spin torque magnetization reversal may also be referred to as a reversal current, a recording current, or the like.

The memory device is a nonvolatile memory and, therefore, it is necessary that the information written by a current is stored stably. That is, it is necessary to ensure the stability (heat stability) of the memory layer to thermal fluctuation of magnetization.

If the heat stability of the memory layer is not ensured, the direction of the reversed magnetization may be reversed again because of heat (temperature in the operation environment), so as to cause a writing error.

The memory element 3 (ST-MRAM) in the present memory device has an advantage in scaling, that is, the volume can be reduced as compared with MRAM in related art. However, when the other characteristics are the same, the reduction in volume may degrade the heat stability.

In the case where the capacity of ST-MRAM is increased, the volume of the memory element 3 is further reduced and, therefore, it is desirable to ensure the heat stability.

Consequently, regarding the memory element 3 in ST-MRAM, the heat stability is a very important characteristic, and it is desirable to design in such a way that the heat stability is ensured eve when the volume is decreased.

2. Outline of Memory Element According to Embodiment

Next, the outline of the memory element according to an embodiment of the present disclosure will be described.

In this embodiment according to the present disclosure, the information is recorded by reversing the direction of magnetization of the memory layer of the memory element through the above-described spin torque magnetization reversal.

The memory layer is formed from a magnetic substance including a ferromagnetic layer and holds the information by the magnetization state (direction of magnetization) of the magnetic substance.

Figure 3:
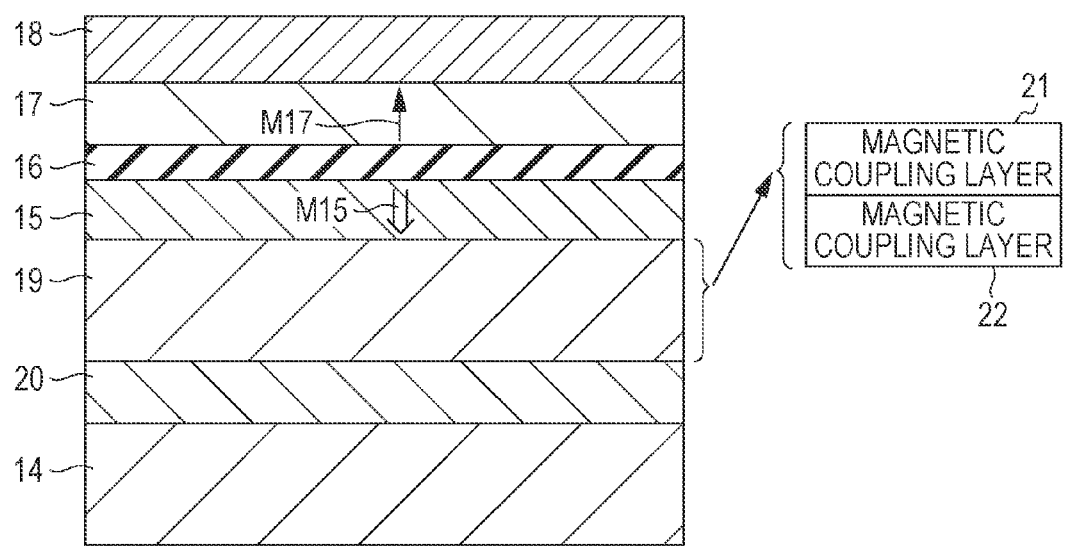
FIG. 3 is a sectional view showing the layered structure of a memory element according to an embodiment.

The memory element 3 is specified to have, for example, a layered structure, an example of which is shown in FIG. 3, and is provided with the memory layer 17 and the magnetization pinned layer 15, which serve as at least two ferromagnetic layers, and an intermediate layer 16 between the two magnetic layers.

The memory layer 17 has magnetization perpendicular to the film surface, and the direction of the magnetization is changed in accordance with the information.

The magnetization pinned layer 15 has magnetization perpendicular to the film surface serving as the reference of the information stored in the memory layer 17.

The intermediate layer 16 is specified to be an insulating layer formed from, for example, a nonmagnetic substance and is disposed between the memory layer 17 and the magnetization pinned layer 15.

Then, spin-polarized electrons are injected in the lamination direction of the layered structure including the memory layer 17, the intermediate layer 16, and the magnetization pinned layer 15 and, thereby, the direction of magnetization of the memory layer 17 is changed, so as to record the information into the memory layer 17.

The spin torque magnetization reversal will be described here briefly.

Electrons have two types of spin angular momentums. These are assumed to be defined as pointing upward and pointing downward. The numbers of the two are the same in the inside of a nonmagnetic substance, and the numbers of the two are different in the inside of a ferromagnetic substance. A case where regarding the magnetization pinned layer 15 and the memory layer 17, which are two layers of ferromagnetic substances constituting the memory element 3, electrons are moved from the magnetization pinned layer 15 to the memory layer 17, while the directions of magnetic moments are opposite to each other, is considered.

The magnetization pinned layer 15 is a pinned magnetic layer, where the direction of magnetic moment is pinned because of a high coercive force.

Regarding electrons passed through the magnetization pinned layer 15, spin polarization, that is, a difference between the numbers of pointing upward and pointing downward, occurs. In the case where the thickness of the intermediate layer 16 serving as a nonmagnetic layer is sufficiently small, the electrons reach the other magnetic substance, that is, the memory layer 17 before the spin polarization resulting from passing through the magnetization pinned layer 15 is relaxed and a non-polarized (the numbers of pointing upward and pointing downward are the same) state of a usual nonmagnetic substance is reached.

In the memory layer 17, the sign of the degree of spin polarization is reverse and, therefore, in order to reduce the energy of the system, a part of electrons are reversed, that is, the direction of spin angular momentum is changed. At this time, the total angular momentum of the system is conserved and, therefore, a reaction equivalent to the total change in angular momentum due to turned electrons is also given to the magnetic moment of the memory layer 17.

In the case where a current, that is, the number of electrons passing in a unit time is small, the total number of turned electrons is also small, so that a change in angular momentum generated in the magnetic moment of the memory layer 17 is small. However, much change in angular momentum is given in a unit time by increasing the current.

The change with time of the angular momentum is a torque. If the torque exceeds a certain threshold value, the magnetic moment of the memory layer 17 begins precession and becomes stable because of uniaxial anisotropy thereof when being turned 180 degrees. That is, reversal from a backward direction state to a forward direction state occurs.

In the case where magnetization is in a forward direction state, in contrary, if a current is passed in the direction of transferring electrons from the memory layer 17 to the magnetization pinned layer 15, electrons subjected to spin reversal when being reflected at the magnetization pinned layer 15 give a torque when entering the memory layer 17 and, thereby, magnetic moment can be reversed to a backward direction state. However, at this time, the amount of current necessary for effecting reversal is larger than that in the case of reversal from the backward direction state to the forward direction state.

It is difficult to intuitively understand the reversal of the magnetic moment from the forward direction state to the backward direction state. However, it may be considered in such a way that the magnetic moment is not reversed because the magnetization pinned layer 15 is pinned and the memory layer 17 is reversed in order to conserve the angular momentum of the whole system. In this manner, 0/1 is recorded by passing a current more than or equal to a certain threshold value, in accordance with each polarity, in the direction from the magnetization pinned layer 15 to the memory layer 17 or in the reverse direction.

The information is read by using the magnetoresistance effect in the same manner as that in MRAM in related art. That is, a current is passed in the direction perpendicular to the film surface in the same manner as in the case of the above-described recording. Then, a phenomenon, in which the electric resistance shown by the element is changed in accordance with whether the magnetic moment of the memory layer 17 is in the forward direction or the backward direction relative to the magnetic moment of the magnetization pinned layer 15, is used.

The material used for the intermediate layer 16 between the magnetization pinned layer 15 and the memory layer 17 may be a metal or an insulating substance. However, in the case where the insulating substance is used as the intermediate layer, a higher read signal (rate of change in resistance) is obtained and, in addition, recording is performed with a lower current. The element at this time is referred to as magnetic tunnel junction (MTJ).

The threshold value Ic of the current necessary when the direction of magnetization of the magnetic layer is reversed through spin torque magnetization reversal is different depending on the easy-to-magnetize axis of the magnetic layer being in the in-plane direction or in the perpendicular direction.

The memory element according to the present embodiment is a perpendicular magnetization type. Regarding in-plane magnetization type memory element in related art, when a reversal current to reverse the direction of magnetization of the magnetic layer is represented by Ic_para, in the case where reversal is performed from the forward direction to the backward direction (where the forward direction and the backward direction are the direction of magnetization of the memory layer with reference to the direction of magnetization of the magnetization pinned layer, and the "forward direction" and the "backward direction" may be referred to as "parallel" and "antiparallel", respectively), $$Ic\_para = (A \cdot \alpha \cdot Ms \cdot V/g(O)/P)(Hk+2\pi Ms)$$

holds, and in the case where reversal is performed from the backward direction to the forward direction, $$Ic\_para = -(A \cdot \alpha \cdot Ms \cdot V/g(\pi)/P)(Hk+2\pi Ms)$$

holds (these formulae are represented by Formula (1)).

Meanwhile, when a reversal current of the perpendicular magnetization type memory element, as in the present example, is represented by Ic_perp, in the case where reversal is performed from the forward direction to the backward direction, $$Ic\_perp = (A \cdot \alpha \cdot Ms \cdot V/g(O)/P)(Hk-4\pi Ms)$$

holds, and in the case where reversal is performed from the backward direction to the forward direction, $$Ic\_perp = -(A \cdot \alpha \cdot Ms \cdot V/g(\pi)/P)(Hk+4\pi Ms)$$

holds (these formulae are represented by Formula (2)).

In this regard, A represents a constant, $\alpha$ represents a dumping constant, Ms represents saturation magnetization, V represents an element volume, P represents spin polarizability, g(O) and g($\pi$) represent coefficients corresponding to the efficiencies of transfer of the spin torque to a counterpart magnetic layer at the time of the forward direction and the backward direction, respectively, and Hk represents magnetic anisotropy.

Regarding each of the above-described Formulae, when (Hk−4πMs) in the case of perpendicular magnetization type and (Hk+2πMs) in the case of in-plane magnetization type are compared, it is understood that the perpendicular magnetization type is more suitable for reduction in recording current.

In the present embodiment, the memory element 3 including the magnetic layer (memory layer 17) to hold the information by the magnetization state and the magnetization pinned layer 15, where the direction of magnetization is pinned, is disposed.

It is necessary that the written information is held in order to be present as memory. The capability to hold the information is determined on the basis of a value of a heat stability index $\Delta$ (=KV/$k_B$T). This $\Delta$ is represented by Formula (3) described below.

$$\Delta = K \cdot V/k_B \cdot T = Ms \cdot V \cdot Hk \cdot (\tfrac{1}{2}k_B \cdot T) \qquad \text{Formula (3)}$$

In this regard, Hk represents effective anisotropic magnetic field, $k_B$ represents a Boltzmann constant, T represents a temperature, Ms represents an amount of saturation magnetization, V represents the volume of the memory layer 17, and K represents anisotropic energy.

The effective anisotropic magnetic field Hk takes in influences of the shape magnetic anisotropy, the induced magnetic anisotropy, the crystal magnetic anisotropy, and the like, and in the case where a single domain coherent model is assumed, this is equivalent to a coercive force.

In many cases, the heat stability index $\Delta$ and the threshold value Ic of the current are in the relationship of trade-off. Consequently, in many cases, it is desirable to ensure the compatibility between them in order to maintain the memory characteristics.

As for the threshold value of the current to change the magnetization state of the memory layer 17, actually, regarding a TMR element, for example, having the thickness of the memory layer 17 of 2 nm and having a two-dimensional pattern nearly in the shape of an ellipse of 100 nm×150 nm, the positive side threshold value +Ic is +0.5 mA, the negative side threshold value −Ic is −0.3 mA, and the current density at that time is about 3.5×10⁶ A/cm². They almost agree with Formula (1) described above.

Meanwhile, regarding usual MRAM in which magnetization removal is effected by a current magnetic field, several mA or more of writing current is necessary.

Therefore, it is clear that ST-MRAM is effective for reducing power consumption of an integrated circuit because the threshold value of the writing current becomes small sufficiently, as described above.

Furthermore, a wiring, which is necessary in usual MRAM, for generating a current magnetic field is unnecessary and, therefore, regarding the degree of integration, there is an advantage as compared with the usual MRAM.

In the case where spin torque magnetization reversal is effected, the information is written (recorded) by passing a current directly to the memory element 3 and, therefore, in order to select the memory element 3 to be written, a memory device is formed by connecting the memory element 3 to a selection transistor.

In this case, the current passed to the memory element 3 is limited by the magnitude of current which can be passed to the selection transistor (saturation current of the selection transistor).

In order to reduce the recording current, it is desirable to adopt the perpendicular magnetization type, as described above. Moreover, the perpendicular magnetization film is preferable from the viewpoint of keeping a large A described above because the perpendicular magnetization film can have high magnetic anisotropy as compared with that of the in-plane magnetization film in general.

Examples of magnetic materials having the perpendicular anisotropy include some types, e.g., rare earth-transition metal alloys (TbCoFe and the like), metal multilayer films (Co/Pd multilayer film and the like), ordered alloys (FePt and the like), and making use of interface anisotropy between an oxide and a magnetic metal (Co/MgO and the like). However, the earth-transition metal alloys lose perpendicular magnetic anisotropy through diffusion by heating and crystallization and are not preferable as the material for ST-MRAM. Meanwhile, it is known that the metal multilayer films are diffused by heating and the perpendicular magnetic anisotropy is degraded. The perpendicular magnetic anisotropy appears in the case of (111) orientation of face centered cubic and, therefore, it is difficult to realize (001) orientation desired for MgO and a high-polarizability layer, e.g., Fe, CoFe, CoFeB, and the like, disposed adjoining MgO. Regarding L10 ordered alloys, the above-described problems do not occur because of stability at high temperatures and perpendicular magnetic anisotropy exhibited at the time of (001) orientation. However, it is necessary to heat at a sufficiently high temperature of 500° C. or higher in production or order atoms by performing a heat treatment at a high temperature of 500° C. or higher after production, so that unfavorable diffusion or an increase in surface roughness may be caused in other portions, e.g., a tunnel barrier, of the laminate film.

On the other hand, regarding the material making use of the interface magnetic anisotropy, that is, a material in which a Co based or Fe based material is stacked on MgO serving as a tunnel barrier, any one of the above-described problems does not occur easily, so that such a material has a potential as a material for the memory layer of ST-MRAM.

Furthermore, in consideration of a saturation current value of the selection transistor, as for the nonmagnetic intermediate layer 16 between the memory layer 17 and the magnetization pinned layer 15, a magnetic tunnel junction (MTJ) element is formed by using a tunnel insulating layer formed from an insulating substance.

In the case where the magnetic tunnel junction (MTJ) element is formed by using the tunnel insulating layer, the magnetoresistance ratio (MR ratio) is increased and the read signal intensity is increased as compared with those in the case where a giant magnetoresistive effect (GMR) element is formed by using a nonmagnetic electrically conductive layer.

In particular, the magnetoresistance ratio (MR ratio) is increased by using magnesium oxide (MgO) as the material for the intermediate layer 16 serving as the tunnel insulating layer.

In general, the efficiency of spin transfer depends on the MR ratio, and as the MR ratio increases, the efficiency of spin transfer is improved and the magnetization reversal current density is reduced.

Therefore, in the case where magnesium oxide is used as the material for the tunnel insulating layer and, at the same time, the above-described memory layer 17 is used, the threshold current of writing through spin torque magnetization reversal is reduced, and the information is written (recorded) with a small current. Furthermore, the read signal intensity is increased.

Consequently, the MR ratio (TMR ratio) is ensured, the threshold current of writing through spin torque magnetization reversal is reduced, and the information is written (recorded) with a small current. Furthermore, the read signal intensity is increased.

In the case where the tunnel insulating layer is formed from the magnesium oxide (MgO) film, it is more desirable that the MgO film is crystallized and the crystal orientation in the 001 direction is maintained.

It is necessary that the sheet resistance value of the tunnel insulating layer is controlled to be several tens of $\Omega\mu m^2$ or less from the viewpoint of obtainment of a current density necessary for reversing the direction of magnetization of the memory layer 17 through spin torque magnetization reversal.

Regarding the tunnel insulating layer formed from the MgO film, it is necessary that the thickness of the MgO film is specified to be 1.5 nm or less in order to specifying the sheet resistance value within the above-described range.

It is desirable that the memory element 3 is miniaturized in such a way that the direction of the magnetization of the memory layer 17 is reversed easily with a small current.

Therefore, preferably, the area of the memory element 3 is specified to be 0.01 $\mu m^2$ or less.

3. Concrete Configuration of Embodiment

The concrete configuration of an embodiment according to the present disclosure will be described.

Regarding the configuration of the memory device, as described in FIG. 1 above, the memory element 3 to hold the information by the magnetization state is disposed in the vicinity of the intersection of the orthogonal two types of address wirings 1 and 6 (for example, word line and bit line).

Then, a current in the vertical direction is passed to the memory element 3 through the two types of address wirings 1 and 6 and, thereby, the direction of magnetization of the memory layer 17 is reversed through spin torque magnetization reversal.

The drain region 8 is disposed while being shared between right and left selection transistors in the drawing, and a wiring 9 is connected to the drain region 8.

The memory element 3 is disposed between the source region 7 and another address wiring (for example, a bit line) 6 which is disposed above and which is extended in the right and left directions in the drawing. The memory element 3 includes the memory layer 17 formed from a ferromagnetic layer, where the direction of magnetization is reversed through spin injection.

The memory element 3 is disposed in the vicinity of the intersection of the two types of address wirings 1 and 6.

The memory element 3 is connected to the bit line 6 and the source region 7 with upper and lower contact layers 4, respectively.

Consequently, it is possible that a current is passed to the memory element 3 through the two types of address wirings 1 and 6 and, thereby, the direction of magnetization of the memory layer 17 is reversed through spin torque magnetization reversal.

FIG. 3 shows a detailed structure of the memory element 3 according to an embodiment of the present disclosure.

As shown in FIG. 3, in the memory element 3, the magnetization pinned layer 15 is disposed as a lower layer relative to the memory layer 17, where the direction of magnetization M17 is reversed through spin torque magnetization reversal.

Regarding ST-MRAM, 0 and 1 of the information are prescribed by relative angles of magnetization M17 of the memory layer 17 and magnetization M15 of the magnetization pinned layer 15. In this case, ST-MRAM by using in-plane magnetization and ST-MRAM by using perpendicular magnetization have been developed. Regarding ST-MRAM by using in-plane magnetization, it is believed that the degree of flexibility in material is high and a method for pinning magnetization is relatively easy.

The intermediate layer 16 serving as a tunnel barrier layer (tunnel insulating layer) is disposed between the memory layer 17 and the magnetization pinned layer 15. The memory layer 17 and the magnetization pinned layer 15 constitute the MTJ element.

Meanwhile, in the case where a perpendicular magnetization film is used, materials having perpendicular magnetic anisotropy are limited. In recent years, an interface anisotropy type perpendicular magnetic film making use of perpendicular magnetic anisotropy, which appears at a crystal interface between Fe and an oxide, has been applied. In the case where the interface anisotropy is used, a perpendicular magnetic film is obtained by using an FeCoB alloy as a magnetic substance and MgO as an oxide, the compatibility between a high magnetoresistance ratio (MR ratio) and perpendicular magnetization is ensured, so that it is possible to apply as a material for the memory layer 17 and the magnetization pinned layer 15.

As for the magnetization pinned layer 15 and the memory layer 17, an alloy containing at least one of Fe, Co, and Ni and at least one of B and C is preferable, and the content of B and C is preferably 5 percent by atom or more and 30 percent by atom or less.

The intermediate layer 16 serving as a tunnel barrier layer (tunnel insulating layer) is disposed between the memory layer 17 and the magnetization pinned layer 15. The memory layer 17 and the magnetization pinned layer 15 constitute the MTJ element. As for the intermediate layer 16, for example, MgO is used.

A magnetic coupling layer 19, a high coercive force layer 20, and a substrate layer 14 are disposed under the magnetization pinned layer 15, and a cap layer 18 is disposed on the memory layer 17.

The high coercive force layer 20 is disposed to make the coercive force of the magnetization pinned layer 15 larger than the coercive force of the memory layer 17. That is, the coercive force of the magnetization pinned layer 15 is enhanced.

The magnetic coupling layer 19 between the high coercive force layer 20 and the magnetization pinned layer 15 is to magnetically couple the magnetization pinned layer 15 with the high coercive force layer 20 in an antiparallel manner. Consequently, leakage magnetic fields from the magnetization pinned layer 15 and the high coercive force layer 20 are mutually cancelled and, favorably, a magnetic effect on the memory layer 17 is reduced.

This magnetic coupling layer 19 is formed from a material, e.g., Ru.

As shown in the right portion of FIG. 3, the magnetic coupling layer 19 is specified to be two layers of a magnetic coupling layer 22 and a magnetic coupling layer 21.

The magnetic coupling layer 22 may be formed from a material, e.g., Ru. The magnetic coupling layer 21 may be formed from at least one material of Cu, Ag, Au, Ta, Zr, Nb, Hf, W, Mo, and Cr. Consequently, the memory element 3 by using perpendicular magnetization is realized, where decreases in MR ratio and heat resistance temperature are suppressed and a stable operation is possible.

Regarding the memory element 3, a laminate structure is formed by forming the appropriate substrate layer 14, forming the high coercive force layer 20 thereon, and forming the magnetic coupling layer 19 of Ru or the like, the magnetic coupling layer 19 of Ta or the like, the magnetization pinned layer 15, the intermediate layer 16, the memory layer 17, and the cap layer 18 sequentially. As for the substrate layer 14, Ta or the like may be used.

As for the method for stacking the materials used in the embodiment according to the present disclosure, a sputtering method, a vacuum evaporation method, a chemical vapor deposition method (CVD), or the like may be used. In order to control crystal orientation and the like, a metal film of Ru, Cr, or the like or an electrically conductive nitride film of TiN or the like may be formed thereon, so as to serve as a substrate layer 14.

As for the high coercive force layer 20, for example, an alloy film of CoPt, FePt, or the like, a continuous laminate film of Co and Pt or Co and Pd, or an alloy film of TbFeCo or the like may be used. A CoPt alloy is favorable because a heat treatment at a high temperature is unnecessary and excellent heat resistance is exhibited.

As for the magnetic coupling layer 22, nonmagnetic metals, e.g., Ru, Re, and Os, which mediate strong magnetic coupling are preferable. As for the magnetic coupling layer 21, any one of Cu, Ag, Au, Ta, Zr, Nb, Hf, W, Mo, and Cr, or a plurality of them in combination are preferable.

The thickness of the magnetic coupling layer 21 is preferably 0.05 nm or more and 0.3 nm or less in the case of Ta, Zr, Nb, Hf, W, Mo, or Cr, and is preferably 0.1 nm or more and 0.5 nm or less in the case of Cu, Ag, and Au. If the thickness of the magnetic coupling layer 21 is less than the specified lower limit, unfavorably, an effect of improving the MR ratio is small. If the thickness is more than the specified upper limit, unfavorably, the magnetic coupling strength between the high coercive force layer 20 and the magnetization pinned layer 15 is small.

In the case where the thickness of the magnetic coupling layer 21 is 0.5 nm or more and 0.9 nm or less, stable antiferromagnetic coupling is obtained. As for the magnetization pinned layer 15 and the memory layer 17, an alloy containing at least one of Fe, Co, and Ni and at least one of B and C is preferable, and the content of B and C is preferably 5 percent by atom or more and 30 percent by atom or less.

It is preferable that the memory layer 17 and the magnetization pinned layer 15 contain at least 30% of Fe in the vicinity of the interface to the intermediate layer 16. If the content is less than that, sufficient perpendicular magnetic anisotropy is not obtained.

As for the intermediate layer 16, MgO, $Al_2O_3$, $TiO_2$, $MgAl_2O_4$, and the like may be used, and it is preferable that MgO is used because the MR ratio is large.

As for the cap layer 18, a metal, e.g., Ta or Ti, an electrically conductive nitride, e.g., TiN, or a combination of a thin insulating layer of MgO or the like and a metal film may be used.

Regarding the configuration of a memory device, a CMOS logic circuit may be formed on a silicon wafer, the above-described laminate film may be formed on a lower electrode, an appropriate shape may be formed by a method of reactive ion etching (RIE), ion milling, chemical etching, or the like, an upper electrode may be formed, and the CMOS logic circuit may be connected in such a way that an appropriate voltage is applied between the upper electrode and the lower electrode. The element may have any shape. However, a circular shape is preferable because, in particular, formation is easy and high density arrangement is possible.

Application of the perpendicular magnetization film according to an embodiment of the present disclosure to a memory device may realize a nonvolatile memory device, where the heat resistance is high, application to a semiconductor process is easy, the magnetoresistance ratio is large, a data reading circuit is simplified, and reading speed is increased.

In the case where the MR ratio is increased, as described above, an efficiency of spin injection may be improved, and a current density necessary for reversing the direction of magnetization M17 of the memory layer 17 may be reduced.

Meanwhile, the heat stability serving as an information holding capability is ensured sufficiently, so that the memory element 3 may be configured to have excellent balance between characteristics.

Consequently, operation errors may be reduced and an operation margin of the memory element 3 may be obtained sufficiently, so that the memory element 3 may be operated stably.

That is, a stably operated high-reliability memory device may be realized.

Furthermore, it may become possible to reduce a rewriting current, so as to reduce power consumption in rewriting into the memory element 3.

Consequently, a stably operated high-reliability memory having an excellent information holding capability may be realized, and power consumption of the memory provided with the memory element 3 may be reduced.

The memory device shown in FIG. 1 provided with the memory element 3 shown in FIG. 3 has an advantage that a general semiconductor MOS formation process is applied to production.

Therefore, the memory according to the present embodiment may be applied to a versatile memory.

4. Experiment on Embodiment

In order to ascertain enhancement of a coercive force and improvement in MR ratio of the memory element 3 according to the present embodiment, in the case where the memory element 3 had a configuration in which the magnetic coupling layer 19 and the high coercive force layer 20 were disposed between the magnetization pinned layer 15 and the substrate layer 14 and the magnetic coupling layer 19 was specified to be two layers of the magnetic coupling layer 22 and the magnetic coupling layer 21, samples shown in FIGS. 4A to 4E and 5 were produced by selecting materials for the individual layers, Experiments 1 to 5 were performed, and the magnetic characteristics thereof were examined.

Regarding the sample for evaluating the magnetic characteristics in the present experiment, Ta having a thickness of 5 nm and Ru having a thickness of 5 nm serving as the substrate layer 14, an alloy film of $Co_{70}Pt_{30}$ serving as the high coercive force layer 20, the magnetic coupling layer 19, the magnetization pinned layer 15, MgO having a thickness of 1 nm serving as the intermediate layer 16, and a laminate film of Ru having a thickness of 1 nm and Ta having a thickness of 5 nm serving as a protective film were used on a silicon substrate with an oxide cover. The above-described sample for evaluation was the sample for evaluating only the magnetization pinned layer 15 side, and in order to form the memory element 3, it was necessary to insert the memory layer 17 between the MgO serving as the intermediate layer and the protective film.

Experiment 1

FIG. 4A shows a sample for Experiment 1, in which the magnetic coupling layer was one layer.

As is shown in FIG. 4A,
substrate layer 14: laminate film of Ta film having a thickness of 5 nm and Ru film having a thickness of 5 nm
high coercive force layer 20: alloy film of $Co_{70}Pt_{30}$ having a thickness of 3 nm
magnetic coupling layer 19: Ru film (film thickness: tRu)

magnetization pinned layer 15: laminate film of $Fe_{64}Co_{16}B_{20}$ alloy film having a thickness of 0.5 nm, Ta film having a thickness of 0.1 nm, and $Fe_{64}Co_{16}B_{20}$ alloy film having a thickness of 0.5 nm
intermediate layer 16: magnesium oxide film having a thickness of 1.0 nm
protective film: laminate film of Ru having a film thickness of 1 nm and Ta having a film thickness of 5 nm.

FIG. 5 shows measurement results of the perpendicular magnetization state of the sample on the basis of a magneto-optical polar Kerr effect. Each of the result after a heat treatment at 300° C. and the result after a heat treatment at 350° C. is shown.

FIG. 5 shows the results of the sample, where the thickness tRu of Ru was changed. In the drawing, the position indicated by HC is a magnetic field at which magnetization reversal occurred while the magnetization pinned layer 15 and the high coercive force layer 20 are magnetically coupled in an antiparallel manner, and $H_{SF}$ indicates a magnetic field at which the magnetic coupling of the magnetization pinned layer 15 and the high coercive force layer 20 is broken. Regarding the heat treatment at 300° C., a change at the $H_{SF}$ point was sharp, so as to indicate that the magnetization pinned layer 15 reversed here was an effective perpendicular magnetization film.

On the other hand, among the samples after the heat treatment at 350° C., for example, regarding the sample of tRu of 0.5 nm, a change was gentle. In this case, perpendicular magnetization of the magnetization pinned layer 15 was insufficient and, therefore, the change in reversal was gentle. When the magnetic field at which magnetization reversal of the magnetization pinned layer 15 occurred was indicated by $H_{SF}$, in the case of $H_{SF}$ or less, the magnetization pinned layer 15 exhibited perpendicular magnetization.

FIG. 4B shows a sample for Experiment 1, in which the magnetic coupling layer was two layers.

As is shown in FIG. 4B,
substrate layer 14: laminate film of Ta film having a thickness of 5 nm and Ru film having a thickness of 5 nm
high coercive force layer 20: alloy film of $Co_{70}Pt_{30}$ having a thickness of 3 nm
magnetic coupling layer 22: Ru film (film thickness: tRu)
magnetic coupling layer 21: Ta film having a thickness of 0.05 nm
magnetization pinned layer 15: laminate film of $Fe_{64}Co_{16}B_{20}$ alloy film having a thickness of 0.5 nm, Ta film having a thickness of 0.1 nm, and $Fe_{64}Co_{16}B_{20}$ alloy film having a thickness of 0.5 nm
intermediate layer 16: magnesium oxide film having a thickness of 1.0 nm
protective film: laminate film of Ru having a film thickness of 1 nm and Ta having a film thickness of 5 nm.

FIG. 6 shows measurement results of the perpendicular magnetization state of the sample on the basis of a magneto-optical polar Kerr effect. Each of the result after a heat treatment at 300° C. and the result after a heat treatment at 350° C. is shown.

In the case where Ta is added to the magnetic coupling layer 19, as shown in FIG. 6, a change in $H_{SF}$ relative to the thickness of Ru of the magnetic coupling layer 22 became small and the range, in which antiparallel was maintained, was enlarged at every temperature as compared with those of the above-described sample in the case where addition was not performed.

Experiment 2

FIG. 4C shows a sample for Experiment 2, in which the magnetic coupling layer was two layers.

As is shown in FIG. 4C,
  substrate layer 14: laminate film of Ta film having a thickness of 5 nm and Ru film having a thickness of 5 nm
  high coercive force layer 20: alloy film of $Co_{70}Pt_{30}$ having a thickness of 3 nm
  magnetic coupling layer 22: Ru film (film thickness: tRu)
  magnetic coupling layer 21: Ta film (film thickness: tTa)
  magnetization pinned layer 15: $Fe_{64}Co_{16}B_{20}$ alloy film having a thickness of 0.8 nm
  intermediate layer 16: magnesium oxide film having a thickness of 1.0 nm
  protective film: laminate film of Ru having a film thickness of 1 nm and Ta having a film thickness of 5 nm.

FIG. 7 shows a change in coupling magnetic field intensity $H_{SF}$ relative to the thickness of Ru of the magnetic coupling layer 22 of the sample. The results after the heat treatment at 300° C. and 350° C. were shown. When the case where Ta was added to Ru of the magnetic coupling layer was compared with the sample in which the magnetic coupling layer was Ru simple substance, regarding the heat treatment at 300° C., the coupling magnetic field intensity was not improved significantly, but regarding the heat treatment at 350° C., the coupling magnetic field intensity in the case where Ta was added was large. Therefore, it was ascertained that addition of Ta exerted an effect of improving the heat resistance.

Furthermore, regarding the thickness of Ru of 0.5 nm to 0.9 nm, the magnetic coupling was not broken easily, so that the thickness of Ru of 0.5 nm to 0.9 nm was favorable.

Experiment 3

Regarding a sample for Experiment 3, the magnetic coupling layer was two layers, and as is shown in FIG. 4D,
  substrate layer 14: laminate film of Ta film having a thickness of 5 nm and Ru film having a thickness of 5 nm
  high coercive force layer 20: alloy film of $Co_{70}Pt_{30}$ having a thickness of 3 nm
  magnetic coupling layer 22: Ru film having a thickness of 0.6 nm
  magnetic coupling layer 21: predetermined element was added
  magnetization pinned layer 15: laminate film of $Fe_{64}Co_{16}B_{20}$ alloy film having a thickness of 0.5 nm, Ta film having a thickness of 0.1 nm, and $Fe_{64}Co_{16}B_{20}$ alloy film having a thickness of 0.5 nm
  intermediate layer 16: magnesium oxide film having a thickness of 1.0 nm
  protective film: laminate film of Ru having a film thickness of 1 nm and Ta having a film thickness of 5 nm.

This sample was to examine differences in characteristics between the case where Ta was added to Ru of the magnetic coupling layer and the case where an element other than Ta was added.

FIG. 8 shows addition layer thickness dependence of the coupling magnetic field intensity $H_{SF}$ after the present sample was heat-treated at 300° C. As for elements added, Ta, Cr, Mg, Si, W, Nb, Zr, Hf, and Mo were employed. Likewise, FIG. 9 shows the results after the heat treatment at 350° C. In the case where the addition elements were Ta, Cr, W, Nb, Zr, Hf, and Mo, an improvement in coupling magnetic field intensity was observed and, in particular, Ta exhibited a large effect of improving the coupling magnetic field intensity after the heat treatment at 350° C.

The film thickness which exhibited improvement was 0.05 nm or more and 0.3 nm or less.

Experiment 4

Regarding a sample for Experiment 4, the magnetic coupling layer was two layers, and as is shown in FIG. 4E,
  substrate layer 14: laminate film of Ta film having a thickness of 5 nm and Ru film having a thickness of 5 nm
  high coercive force layer 20: alloy film of $Co_{70}Pt_{30}$ having a thickness of 3 nm
  magnetic coupling layer 22: Ru film having a thickness of 0.8 nm
  magnetic coupling layer 21: predetermined element was added
  magnetization pinned layer 15: laminate film of $Fe_{64}Co_{16}B_{20}$ alloy film having a thickness of 0.8 nm, Ta film having a thickness of 0.3 nm, and $Fe_{64}Co_{16}B_{20}$ alloy film having a thickness of 0.8 nm
  intermediate layer 16: magnesium oxide film having a thickness of 1.0 nm
  protective film: laminate film of Ru having a film thickness of 1 nm and Ta having a film thickness of 5 nm.

This sample was to examine differences in characteristics in the case where an element of Cu, Ag, or Au was added to Ru of the magnetic coupling layer.

FIG. 10 shows addition layer thickness dependence of the coupling magnetic field intensity $H_{SF}$ of the sample after the present sample was heat-treated at 300° C. and 350° C. In the same manner as the results of Experiment 3, an effect of improving the coupling magnetic field intensity was observed in all cases of Cu, Ag, and Au. Regarding these elements, the film thickness which exhibited improvement in coupling magnetic field intensity was 0.1 nm or more and 0.5 nm or less.

Experiment 5

In Experiment 5, a memory element provided with a memory layer was formed and the magnetoresistance ratio (MR ratio) was measured.

FIG. 11 shows samples for Experiment 5. As shown in FIG. 11, five types of samples were prepared.

(1) Sample Including One Magnetic Coupling Layer
  substrate layer 14: laminate film of Ta film having a thickness of 5 nm and Ru film having a thickness of 5 nm
  high coercive force layer 20: alloy film of CoPt having a thickness of 2 nm
  magnetic coupling layer 19: Ru film having a thickness of 0.8 nm
  magnetization pinned layer 15: $Fe_{64}Co_{16}B_{20}$ alloy film having a thickness of 0.8 nm
  intermediate layer 16: magnesium oxide film having a thickness of 1.0 nm
  memory layer 17: $Fe_{64}Co_{16}B_{20}$ alloy film having a thickness of 1.4 nm
  protective film: Ta film having a thickness of 5 nm (2) Sample 1 Including Two Magnetic Coupling Layers
  substrate layer 14: laminate film of Ta film having a thickness of 5 nm and Ru film having a thickness of 5 nm
  high coercive force layer 20: alloy film of CoPt having a thickness of 2 nm
  magnetic coupling layer 22: Ru film having a thickness of 0.6 nm
  magnetic coupling layer 21: Ta film having a thickness of 0.1 nm
  magnetization pinned layer 15: $Fe_{64}Co_{16}B_{20}$ alloy film having a thickness of 0.8 nm
  intermediate layer 16: magnesium oxide film having a thickness of 1.0 nm
  memory layer 17: $Fe_{64}Co_{16}B_{20}$ alloy film having a thickness of 1.4 nm
  protective film: Ta film having a thickness of 5 nm (3) Sample 2 Including Two Magnetic Coupling Layers
  substrate layer 14: laminate film of Ta film having a thickness of 5 nm and Ru film having a thickness of 5 nm high coercive force layer 20: alloy film of CoPt having a thickness of 2 nm magnetic coupling layer 22: Ru film having a thickness of 0.6 nm magnetic coupling layer 21: Ta film having a thickness of 0.1 nm magnetization pinned layer 15: $Fe_{64}Co_{16}B_{20}$ alloy film having a thickness of 1.2 nm intermediate layer 16: magnesium oxide film having a thickness of 1.0 nm memory layer 17: $Fe_{64}Co_{16}B_{20}$ alloy film having a thickness of 1.4 nm protective film: Ta film having a thickness of 5 nm (4) Sample 3 Including Two Magnetic Coupling Layers substrate layer 14: laminate film of Ta film having a thickness of 5 nm and Ru film having a thickness of 5 nm high coercive force layer 20: alloy film of CoPt having a thickness of 2 nm magnetic coupling layer 22: Re film having a thickness of 0.7 nm magnetic coupling layer 21: Ta film having a thickness of 0.1 nm magnetization pinned layer 15: $Fe_{64}Co_{16}B_{20}$ alloy film having a thickness of 0.8 nm intermediate layer 16: magnesium oxide film having a thickness of 1.0 nm memory layer 17: $Fe_{60}Ni_{30}C_{10}$ alloy film having a thickness of 1.2 nm protective film: Ta film having a thickness of 5 nm (5) Sample 4 Including Two Magnetic Coupling Layers substrate layer 14: laminate film of Ta film having a thickness of 5 nm and TiN film having a thickness of 5 nm high coercive force layer 20: alloy film of FePt having a thickness of 2 nm magnetic coupling layer 22: Os film having a thickness of 0.8 nm magnetic coupling layer 21: Ta film having a thickness of 0.05 nm magnetization pinned layer 15: $Fe_{50}Co_{10}Cr_{20}B_{20}$ alloy film having a thickness of 1.0 nm intermediate layer 16: magnesium oxide film having a thickness of 1.0 nm memory layer 17: $Fe_{64}Co_{16}B_{20}$ alloy film having a thickness of 1.5 nm protective film: Ta film having a thickness of 5 nm Table 1 shows the measurement results of MR ratios of the above-described samples after being heat-treated at 300° C. and 350° C. Regarding the memory element according to the present embodiment, the MR ratio was improved significantly by the heat treatment at, in particular, 350° C. Therefore, it is clear that the technology according to an embodiment of the present disclosure exerts a large effect of improving the heat resistance and the MR ratio.

TABLE 1

|  | MR ratio after 300° C. heat treatment | MR ratio after 350° C. heat treatment |
| --- | --- | --- |
| Sample including one magnetic coupling layer | 76% | 54% |
| Sample 1 | 87% | 90% |
| Sample 2 | 80% | 93% |
| Sample 3 | 77% | 83% |
| Sample 4 | 72% | 80% |

Up to this point the embodiments have been explained. The present disclosure is not limited to the film configuration of the memory element 3 shown in the above-described individual embodiments, and various film configurations may be adopted.

For example, in the embodiment, the magnetization pinned layer 15 is specified to be CoFeB, although not limited to this embodiment. Various other configurations may be employed within the bound of not departing from the gist of the present disclosure.

In the embodiment, only one type of substrate and the like are shown, although not limited to them. Various other configurations may be employed within the bound of not departing from the gist of the present disclosure.

In the embodiment, as for the magnetization pinned layer 15, a laminate ferri-pinned structure composed of two ferromagnetic layers and a nonmagnetic layer is used. However, a structure in which an antiferromagnetic layer is added to a laminate ferri-pinned structure film may be employed.

As a matter of course, a single layer may be employed.

Regarding the film configuration of the memory element 3, whether the memory layer 17 is disposed on the upper side of the magnetization pinned layer 15 or on the lower side causes no problem.

The present disclosure may include the following configurations.

(1) A memory element including a memory layer to hold the information by the magnetization state of a magnetic substance, a magnetization pinned layer having magnetization serving as a reference of the information stored in the memory layer, an intermediate layer formed from a nonmagnetic substance disposed between the memory layer and the magnetization pinned layer, a magnetic coupling layer disposed adjoining the magnetization pinned layer and opposing to the intermediate layer, and a high coercive force layer disposed adjoining the magnetic coupling layer, wherein the information is stored by reversing magnetization of the memory layer, making use of spin torque magnetization reversal generated along with a current passing in the lamination direction of the layered structure including the memory layer, the intermediate layer, and the magnetization pinned layer, and the magnetic coupling layer has a two-layer laminate structure.

(2) The memory element according to the item (1), wherein the memory layer and the magnetization pinned layer contain at least one of Fe, Co, and Ni as a primary component and 5 percent by atom or more and 30 percent by atom or less of at least one of B and C.

(3) The memory element according to the item (1) or (2), wherein the layer on the high coercive force layer side of the two layers in the magnetic coupling layer is formed from at least one of Ru, Re, and Os.

(4) The memory element according to any one of the items (1) to (3), wherein the layer on the magnetization pinned layer side of the two layers in the magnetic coupling layer is formed from at least one of Cu, Ag, Au, Ta, Zr, Nb, Hf, W, Mo, and Cr.

(5) The memory element according to any one of the items (1) to (3), wherein the layer on the magnetization pinned layer side of the two layers in the magnetic coupling layer is formed from at least one of Ta, Zr, Nb, Hf, W, Mo, and Cr, and the thickness of the layer is 0.05 nm to 0.3 nm (6) The memory element according to any one of the items (1) to (3), wherein the layer on the magnetization pinned layer side of the two layers in the magnetic coupling layer is formed from at least one of Cu, Ag, and Au, and the thickness of the layer is 0.1 nm to 0.5 nm (7) The memory element according to any one of the items (1) to (6), wherein the thickness of the layer on the high coercive force layer is 0.5 nm t 0.9 nm.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A spin transfer torque memory element comprising:
   a first portion including CoFeB;
   a second portion including CoFeB;
   an intermediate portion interposed between the first and second portions, the intermediate portion including MgO;
   a third portion adjoining the second portion opposite the intermediate portion, the third portion including at least one of Ag, Au, Cr, Cu, Hf, Mo, Nb, Os, Re, Ru, Ta, W, and Zr; and
   a fourth portion adjoining the third portion opposite the second portion, the fourth portion including at least one alloy of Co, Fe, Pd, and Pt.

2. The spin transfer torque memory element according to claim 1, wherein the third portion includes at least one of Ru, Ta, and W.

3. The spin transfer torque memory element according to claim 1, wherein the fourth portion includes CoPt.

4. The spin transfer torque memory element according to claim 1, wherein the third portion includes a first layer adjoining the second portion and a second layer adjoining the fourth portion.

5. The spin transfer torque memory element according to claim 4, wherein a thickness of the first layer is 0.05 nm to 0.3 nm.

6. The spin transfer torque memory element according to claim 4, wherein a thickness of the first layer is 0.1 nm to 0.5 nm.

7. The spin transfer torque memory element according to claim 4, wherein a thickness of the second layer is 0.5 nm to 0.9 nm.

8. The spin transfer torque memory element according to claim 1, wherein a thickness of the fourth portion is 2 nm to 3 nm.

9. The spin transfer torque memory element according to claim 1, wherein at least one of the first and second portions defines a film surface and is configured to change magnetization through spin torque magnetization reversal along a direction perpendicular to the film surface.

10. The spin transfer torque memory element according to claim 1, wherein the first portion is a magnetic free layer and the second portion is a magnetization pinned layer.

11. A memory device comprising:
    a spin transfer torque memory element configured to be disposed between two wires that intersect each other when viewed along a direction perpendicular to the two wires, the spin transfer torque memory element holding information according to a magnetization state of a magnetic material, the memory element including a first portion including CoFeB, a second portion including CoFeB, an intermediate portion interposed between the first and second portions, the intermediate portion including MgO, a third portion adjoining the second portion opposite the intermediate portion, the third portion including at least one of Ag, Au, Cr, Cu, Hf, Mo, Nb, Os, Re, Ru, Ta, W, and Zr, and a fourth portion adjoining the third portion opposite the second portion, the fourth portion including at least one alloy of Co, Fe, Pd, and Pt.

12. The memory device according to claim 11, wherein the third portion includes at least one of Ru, Ta, and W.

13. The memory device according to claim 11, wherein the fourth portion includes CoPt.

14. The memory device according to claim 11, wherein the third portion includes a first layer adjoining the second portion and a second layer adjoining the fourth portion.

15. The memory device according to claim 14, wherein a thickness of the first layer is 0.05 nm to 0.3 nm.

16. The memory device according to claim 14, wherein a thickness of the first layer is 0.1 nm to 0.5 nm.

17. The memory device according to claim 14, wherein a thickness of the second layer is 0.5 nm to 0.9 nm.

18. The memory device according to claim 11, wherein a thickness of the fourth portion is 2 nm to 3 nm.

19. The memory device according to claim 11, wherein at least one of the first and second portions defines a film surface and is configured to change the magnetization state through spin torque magnetization reversal along a direction perpendicular to the film surface.

20. The memory device according to claim 11, wherein the first portion is a magnetic free layer and the second portion is a magnetization pinned layer.

* * * * *